United States Patent
Iwase et al.

(10) Patent No.: US 10,105,874 B2
(45) Date of Patent: Oct. 23, 2018

(54) IMPRINTING METHOD AND IMPRINTING DEVICE

(71) Applicant: Panasonic Intellectual Property Management Co., Ltd., Osaka (JP)

(72) Inventors: Teppei Iwase, Hyogo (JP); Akihiro Ishikawa, Osaka (JP); Toshihiko Wada, Osaka (JP)

(73) Assignee: Panasonic Intellectial Property Management Co., Ltd., Osaka (JP)

( * ) Notice: Subject to any disclaimer, the term of this patent is extended or adjusted under 35 U.S.C. 154(b) by 76 days.

(21) Appl. No.: 14/997,535

(22) Filed: Jan. 17, 2016

(65) Prior Publication Data

US 2016/0332341 A1 Nov. 17, 2016

(30) Foreign Application Priority Data

May 14, 2015 (JP) .................................. 2015-098654

(51) Int. Cl.
 *B29C 59/02* (2006.01)
 *B29C 35/08* (2006.01)
 (Continued)

(52) U.S. Cl.
 CPC ...... *B29C 35/0805* (2013.01); *B29C 37/0003* (2013.01); *B29C 43/021* (2013.01);
 (Continued)

(58) Field of Classification Search
 CPC ............ B29C 43/50; B29C 2035/0827; B29C 35/0805; B29C 37/0003; B29C 43/021;
 (Continued)

(56) References Cited

U.S. PATENT DOCUMENTS

| 4,897,228 A | 1/1990 | Miwa et al. |
| 8,770,965 B2 * | 7/2014 | Washiya ................ B82Y 10/00 264/293 |

(Continued)

FOREIGN PATENT DOCUMENTS

| JP | 2011-187649 | 9/2011 |
| JP | 2014-054735 | 3/2014 |
| JP | 54993068 | 5/2014 |

OTHER PUBLICATIONS

Ahn, Se Hyun et al. "High-Speed Roll-to-Roll Nanoimprint Lithography on Flexible Plastic Substrates." Adv. Mater. 2008, 20, 2044-2049.*

(Continued)

*Primary Examiner* — Matthew J Daniels
*Assistant Examiner* — Hana C Page
(74) *Attorney, Agent, or Firm* — Panasonic IP Management; Kerry S. Culpepper

(57) ABSTRACT

An imprinting method includes a resin application process of applying a light curing resin so that the resin covers a surface of the substrate and protrudes from an outer periphery of the substrate to contact an adhesive sheet in a state where a reverse surface of the substrate is adhered to the adhesive sheet, an advance curing process of curing the light curing resin contacting the adhesive sheet by irradiating the substrate with light from the reverse surface side, a pressurizing process of pressing a fine pattern formed in a mold onto the light curing resin on the surface of the substrate, a curing process of curing the light curing resin on the surface of the substrate by irradiating the substrate with light from the surface side and a mold releasing process of releasing the mold from the light curing resin by performing peeling from a portion cured on the adhesive sheet.

1 Claim, 10 Drawing Sheets

(51) Int. Cl.
    *B29C 43/02*    (2006.01)
    *B29C 37/00*    (2006.01)
    *G03F 7/00*    (2006.01)
(52) U.S. Cl.
    CPC .... *G03F 7/0002* (2013.01); *B29C 2035/0827* (2013.01); *B29C 2059/023* (2013.01)
(58) Field of Classification Search
    CPC . B29C 2059/023; B29C 35/08; G03F 7/0002; H01L 21/027
    USPC ........................................................ 156/242
    See application file for complete search history.

(56) References Cited

U.S. PATENT DOCUMENTS

| | | |
|---|---|---|
| 2002/0089279 A1 | 7/2002 | Kisu |
| 2006/0198917 A1* | 9/2006 | Ho ........................ B29C 59/022 425/174.4 |
| 2009/0039291 A1 | 2/2009 | Furuta et al. |
| 2009/0174118 A1 | 7/2009 | Maeda et al. |
| 2010/0059904 A1 | 3/2010 | Kasumi |
| 2011/0236265 A1 | 9/2011 | Hasui et al. |
| 2014/0147543 A1 | 5/2014 | Kawaguchi et al. |

OTHER PUBLICATIONS

English Translation of KR 20120016128. Shinichi, Nakano. Published Feb. 22, 2012.*

* cited by examiner

IMPRINTING METHOD AND IMPRINTING DEVICE

TECHNICAL FIELD

The technical field relates to an imprinting method and an imprinting device.

BACKGROUND

In recent years, in optical components used for products such as a display and a lighting device, it is desirable to realize a device having the expression of an unprecedented new function which controls reflection and diffraction of light by forming a fine pattern in nanometer (nm) order to micron (μm) order exerting particular optical characteristics. As methods for forming the fine pattern, an imprinting technique is attracting attention recently in addition to a photolithography technique and an electron beam lithography technique.

The imprinting technique is a method of forming the fine pattern of a mold by pressing the mold in which the fine pattern is previously processed on the surface onto a resin applied to a substrate surface.

As imprinting methods, there are a thermal imprinting method in which the mold heated to be higher than a glass transition temperature is pressed onto a thermoplastic resin applied to the substrate surface to thereby transfer the fine pattern and a UV imprinting method in which a UV curing resin is used and irradiated with a UV light while pressing the mold to thereby transfer the fine pattern.

Although the thermal imprinting method has a feature in which the selectivity in the material is wide, there is a problem that the throughput is low as it is necessary to increase and decrease the temperature of the mold at the time of transferring the fine pattern. On the other hand, in the UV imprinting method, the selectivity in the material is narrower than that of the thermal imprinting method as materials are limited to materials to be cured by ultraviolet rays. However, there is an advantage that the throughput is extremely high as the curing can be completed for several seconds to several tens of seconds. Which of the thermal imprinting method and the UV imprinting method is adopted depends on devices to which the method is applied. The UV imprinting method is considered to be suitable for the mass production method when there is no problem caused by the material.

(Imprinting Technique)

A common process flow for forming a fine pattern by the UV imprinting method will be explained. FIG. 13 show schematic diagrams of a common flat-plate imprinting process. First, a UV curing resin 12 is applied to the entire surface of a substrate 11 by using a spin-coating method and so on. Next, the substrate 11 is arranged on a flat stage 13, and a mold 14 in which a fine structure is formed is pressurized from above to contact the resin. As a pressurizing method, a method of pressing the mold by a flat tool 15 is in common use. Then, UV irradiation is performed by a UV irradiator 16 from above the mold 14 and the flat tool 15 to thereby cure the UV curing resin 12. Lastly, the mold 14 is released from the UV curing resin 12 by moving the flat tool 15 and the mold 14 upward.

However, as a direction of releasing the mold is a vertical direction with respect to a transfer plane in the above method, a large mold-release resistance is generated between the mold 14 and the cured UV curing resin 12. Accordingly, there is a problem that film peeling occurs between the UV curing resin 12 and the substrate 11 at the time of releasing the mold 14 from the UV curing resin 12 and thus the transfer quality of the fine pattern is not stabilized.

Japanese Patent No. 5499306 (Patent Document 1) discloses an imprinting method in which a film-shaped mold 14 is peeled off and released by lifting mold holding tools 17 arranged in end portions after the transfer as shown in FIG. 14. As the mold is released by peeling, not releasing the mold in the vertical direction with respect to the transfer plane, the mold-release resistance can be reduced and the transfer quality of the fine pattern can be stabilized. JP-A-2014-54735 (Patent Document 2) discloses an imprinting method in which the film-shaped mold 14 is peeled off and released by moving the mold 14 in the left direction in the drawing while pressing the mold 14 by using a pressurizing roll 151 as a pressurizing means and lifting the mold holding tool 17 after the transfer as shown in FIG. 15. Also in this case, the mold-release resistance can be reduced and the transfer quality of the fine pattern can be stabilized.

SUMMARY

Both of the above means are effective to some degree as methods for improving the mold releasing property, however, it may be difficult according to the adhesive property of the UV curing resin 12 with respect to the substrate 11 and the mold releasing property of the UV curing resin 12 with respect to the mold 14, and it is difficult to say that the mold can be released in good condition in all cases. The mechanism of defects in the mold release occurring according to the various materials, the adhesive property and the mold releasing property will be specifically shown below.

FIG. 16 is an enlarged cross-sectional view showing a state of a mold releasing process at an end portion of the substrate 11 in the related-art imprinting method. Actually, inorganic materials such as silicon and glass are used as materials for the substrate 11 in many cases, therefore, these materials hardly obtain the sufficient adhesive property with respect to an organic resin which is the UV curing resin 12 in many cases. Accordingly, the adhesive property is secured by performing the silane coupling treatment and so on to the substrate 11 in advance, however, there is a case where it is difficult to secure the stable adhesive property due to temperature conditions of the coupling treatment. In such case, the adhesive force at an adhesive point P1 between the UV curing resin 12 and the substrate 11 may be unstable and small. Moreover, organic resins such as acrylic and epoxy are used as materials for the mold 14 in many cases, which are the same quality as the UV curing resin 12, therefore, a large adhesive force is generated at the time of curing in many cases. Although the adhesive force is reduced by allowing the mold 14 or the UV curing resin 12 to contain a fluorine-based material, this may be also unstable due to curing conditions and so on. Accordingly, the adhesive force at an adhesive point P2 between the UV curing resin 12 and the mold 14 may be large. Therefore, there are problems that the adhesive force at the adhesive point P2 between the UV curing resin 12 and the mold 14 becomes larger than the adhesive force at the adhesive point P1 between the UV curing resin 12 and the substrate 11 at the time of releasing the mold and film peeling occurs between the substrate 11 and the UV curing resin 12 as shown in FIG. 16, which makes the transfer quality of the fine pattern unstable.

In view of the above, a concern of the present disclosure is to stabilize the transfer quality of the fine pattern by improving the mold releasing property of imprinting.

Accordingly, an imprinting method according to an embodiment includes a resin application process of applying a light curing resin so that the resin covers a surface of the substrate and protrudes from an outer periphery of the substrate to contact an adhesive sheet in a state where a reverse surface of the substrate is adhered to the adhesive sheet, an advance curing process of curing the light curing resin contacting the adhesive sheet by irradiating the substrate with light from the reverse surface side, a pressurizing process of pressing a fine pattern formed in a mold onto the light curing resin on the surface of the substrate, a curing process of curing the light curing resin on the surface of the substrate by irradiating the substrate with light from the surface side, and a mold releasing process of releasing the mold from the light curing resin by performing peeling from a portion cured on the adhesive sheet.

When adopting the imprinting method, the mold releasing property of imprinting can be improved and the transfer quality of the fine pattern can be stabilized.

DESCRIPTION OF EMBODIMENTS

Embodiment 1

Figure 1A:
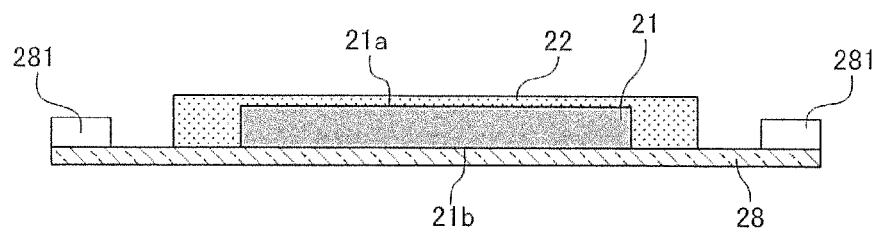
FIG. 1A shows a resin application process in an imprinting method according to Embodiment 1.

An imprinting method and an imprinting device according to Embodiment 1 will be explained with reference to the drawings. The imprinting device includes an adhesive sheet 28, a stage 23, a mold 24, a flat tool 25, a UV irradiator 26, an advance UV irradiator 29 and a not-shown resin application device as shown in FIGS. 1A to 1E. Specific operations of respective components will be explained with the following explanation of the imprinting method.

FIG. 1A to 1D are schematic views showing a process flow of the imprinting method according to Embodiment 1. First, a UV curing resin 22 is applied to a substrate 21 in a resin application process shown in FIG. 1A. A reverse surface 21b of the substrate 21 is previously adhered to the adhesive sheet 2B to hold the substrate 21. The adhesive sheet 26 is fixed to adhesive sheet regulation jigs 281 to be stretched so that a certain tension is applied to the adhesive sheet 28. The UV curing resin 22 is applied to the substrate 21 prepared in the above state by a resin application device. In this case, the UV curing resin 22 is applied so that the resin covers a surface 21a of the substrate 21 and protrudes from an outer periphery of the substrate 21 to contact the adhesive sheet 28. As an application method, various methods may be adopted in accordance with the viscosity of the material such as a spin coating method, a screen printing method and an electrostatic coating method. Various structures of the resin application devices can be adopted according to the method of application. Various materials can be considered for the substrate 21 according to target products. For example, silicon, sapphire, gallium nitride and so on can be cited.

Figure 1B:
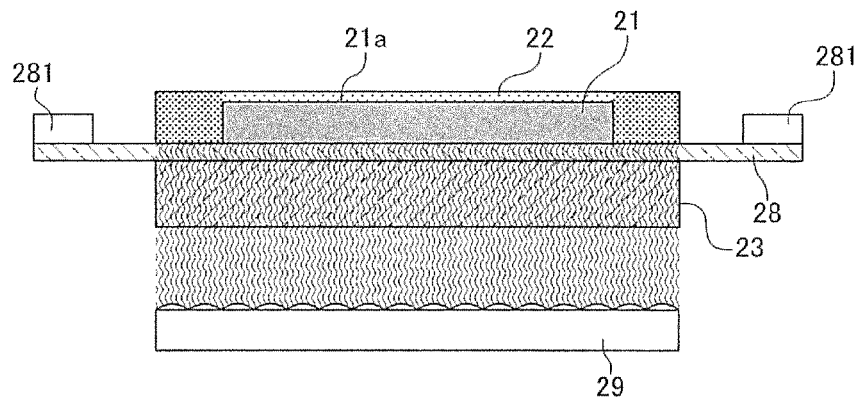
FIG. 1B shows an advance curing process in the imprinting method.

Next, the UV curing resin 22 at an outer peripheral portion of the substrate 21 to which the UV curing resin 22 is applied is cured in an advance curing process shown in FIG. 1B. The substrate 21 adhered to the adhesion sheet 2B is installed on the stage 23 through the adhesive sheet 28. The stage 23 is made of a material which can transmit light, for example, made of quartz glass. The advance UV irradiator 29 which can emit the UV light upward is arranged below the stage 23, emitting the UV light from below after the substrate 21 is set. As the substrate 21 does not transmit the UV light in this case, the UV curing resin 22 on the substrate surface 21a is not cured because the substrate 21 becomes a shield, and only the UV curing resin 22 protruding from the outer periphery of the substrate 21 and contacting the adhesive sheet 28 is cured.

Figure 1C:
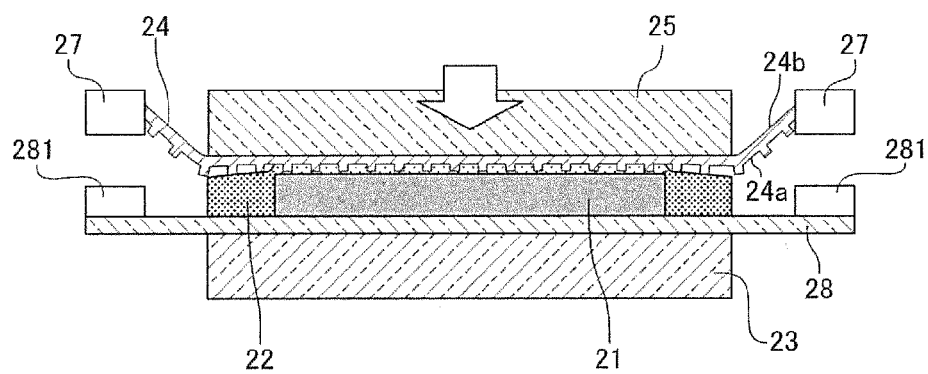
FIG. 1C shows a pressurizing method in the imprinting method.

Then, a second surface 24b of the mold 24 in which a fine pattern is formed on a first surface 24a is pressurized with respect to the substrate 21 arranged on the stage 23 by the flat tool 25 in a pressurization process shown in FIG. 1C. Though various methods can be applied to the forming method, a flat plate method will be explained as a typical example here. Specifically, the mold 24 has a film shape and attached to mold holding tools 27 with a certain tension. The second surface 24b of the mold 24 is pressurized by the flat tool 25 from above and the fine pattern formed on the first surface 24a of the mold 24 is pressed onto the UV curing resin 22 on the substrate 21 to fill the fine pattern with the UV curing resin 22.

Figure 1D:
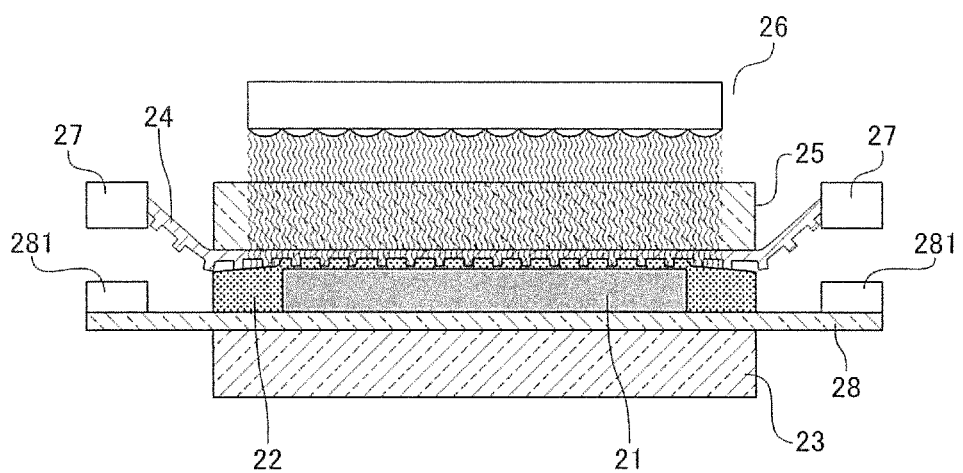
FIG. 1D shows a curing process in the imprinting method.

After that, the UV curing resin 22 applied to the substrate 21 is cured in a curing process shown in FIG. 1D. The flat tool 25 has a light transmittance and is made of, for example, quarts glass. The mold 24 has a light transmittance and can transmit almost all the UV light emitted from the UV irradiator 26 arranged in an upper direction to a lower direction, therefore, the UV curing resin 22 can be cured.

Figure 1E:
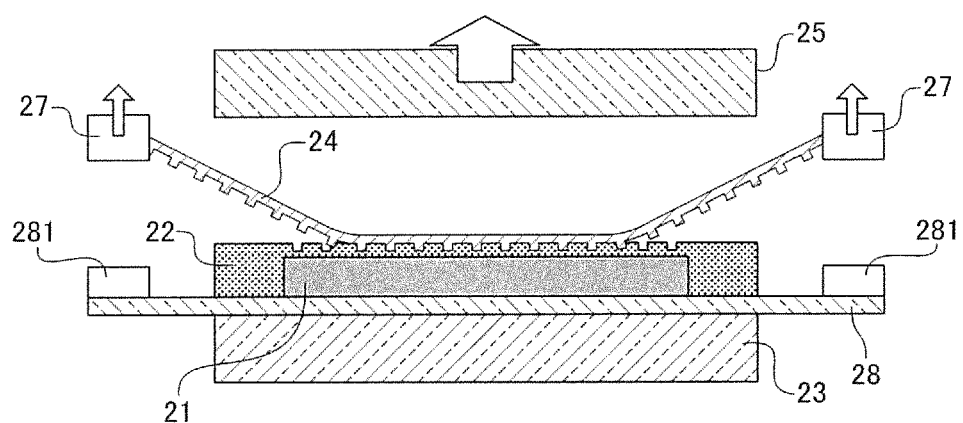
FIG. 1E shows a mold releasing process in the imprinting method.

Lastly, the mold 24 is released from the cured UV curing resin 22 in a mold releasing process shown in FIG. 1E. At this time, the flat tool 25 is allowed to retreat upward by releasing pressurization. When the film-shaped mold 24 is released, the mole holding tools 27 are lifted, thereby releasing the mold 24 so as to be peeled off from end portions of the substrate 21. Accordingly, the mold releasing property of imprinting can be improved, and the transfer quality of the fine pattern can be improved. Hereinafter, the detailed explanation will be made with reference to FIG. 2 and FIG. 3.

Figure 2:
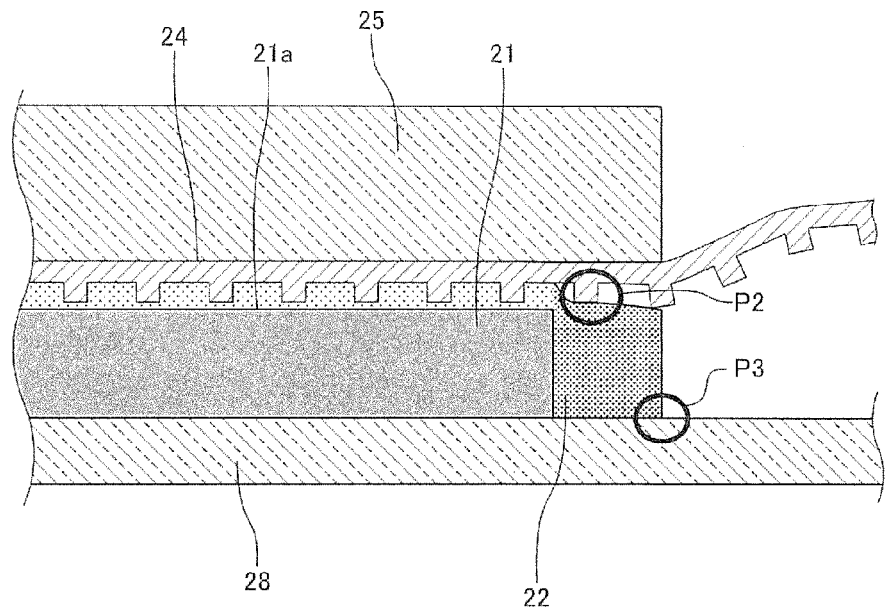
FIG. 2 is a schematic view for explaining effects in Embodiment 1.
Figure 3:
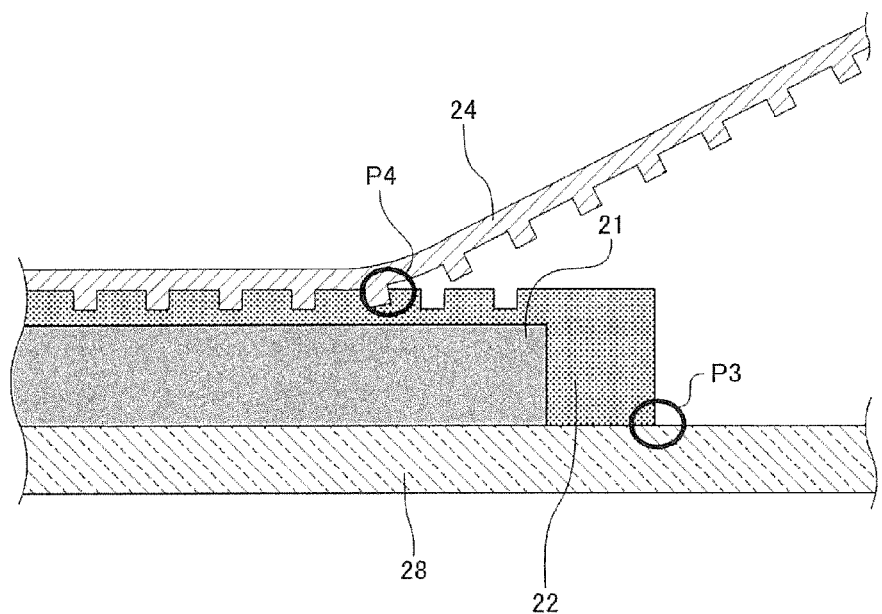
FIG. 3 is a schematic view for explaining effects according to Embodiment 1.

FIG. 2 is an enlarged cross-sectional view showing a state at an end portion of the substrate in the pressurizing process according to the embodiment and FIG. 3 is an enlarged cross-sectional view showing a state of a substrate end portion in the mold releasing process according to the embodiment. The same symbols are given to portions which are the same as or correspond to those of FIGS. 1A to 1E. In the pressurizing process shown in FIG. 2, the mold 24 contacts the UV curing resin 22. As the UV curing resin 22 is a viscous body before being cured on the surface 21a of the surface 21, the inside of the pattern of the mold 24 is filled with the UV curing resin 22. On the other hand, the UV curing resin 22 is cured in an area where the UV curing resin 22 protrudes from the outer periphery of the substrate 21 and contacts the adhesive sheet 28 in the advance curing process of FIG. 1B, therefore, the UV curing resin 22 does not have stickiness and viscosity, becoming an elastic body having a certain hardness. Accordingly, the adhesive force at the adhesive point P2 between the UV curing resin 22 and the mold 24 is significantly reduced. On the other hand, the adhesive force at an adhesive point P3 between the UV curing resin 22 and the adhesive sheet 28 in the area is significantly increased as the UV curing resin 22 is cured in the advance curing process and the stickiness of the adhesive sheet 28 acts to thereby form an adhering interface between the UV curing resin 22 and the adhesive sheet 28.

When the process proceeds to the mold releasing process shown in the following FIG. 3 in the above state, the adhesive force at the adhesive point P3 between the UV curing resin 22 and the adhesive sheet 28 becomes significantly higher than the adhesive force at the adhesive point P2 between the UV curing resin 22 and the mold 24. Accordingly, the peeling surely occurs from the mold 24 side. In order to peel a portion of the mold on the substrate 21 from the UV curing resin 22, a certain mold releasing resistance is necessary in an adhesive point P4 between the substrate 21 and the UV curing resin 22. Here, the peeling already progresses from an end portion of the mold 24, therefore, the mold releasing resistance at the adhesive point P4 is sufficiently smaller than the adhesive force at the adhesive point P3. As a power point at the time of peeling exists on the adhesive point P4 and is far from the portion of the adhesive point P3, the film peeling hardly occurs between the substrate 21 and the UV curing resin 22. Accordingly, the mold releasing property of imprinting can be improved and the transfer quality of the fine pattern can be stabilized.

Figure 4:
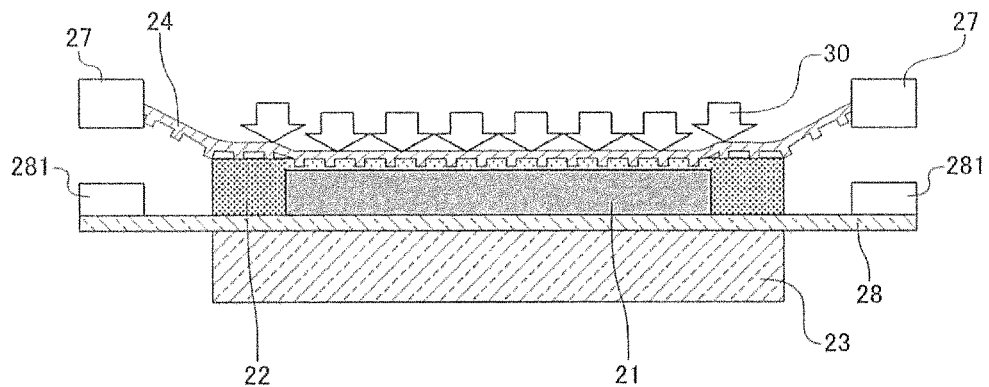
FIG. 4 shows another example concerning the pressuring process according to Embodiment 1.

The method of using the flat tool is cited as a typical example of the pressurizing method in Embodiment 1, however, the pressurizing method is not limited to this, and the same effects can be expected when adopting a method of pressuring the entire surface of the substrate 21 by a fluid pressure 30 such as air, for example, as shown in FIG. 4. In FIG. 4, the same symbols are given to portions which are the same as or correspond to those of FIGS. 1A to 1E. It is also possible to adopt a method of using a later-described pressurizing roll as the pressurizing method.

Figure 5:
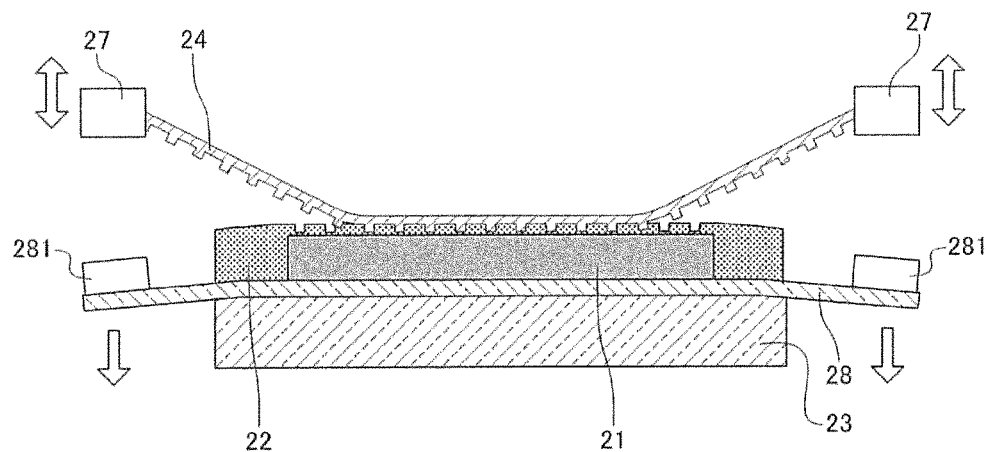
FIG. 5 shows another example concerning the mold releasing process according to Embodiment 1.

However, in the method in which the mold 24 is peeled off from the end portion by lifting the mold holding tools 27 in the mold releasing process, it is also possible to reduce the mold releasing resistance between the mold 24 on the substrate 21 and the UV curing resin 22 and to realize more stable mold releasing by adopting a method of microscopically swinging the mold holding tools 27 in the upper and lower direction, such as ultrasonic vibration as shown in FIG. 5. Moreover, the adhesive sheet regulation jigs 281 are moved downward at the same time, thereby increasing an opening angle made by the mold 24 and the UV curing resin 22 more and improving the mold releasing property.

Figure 6:
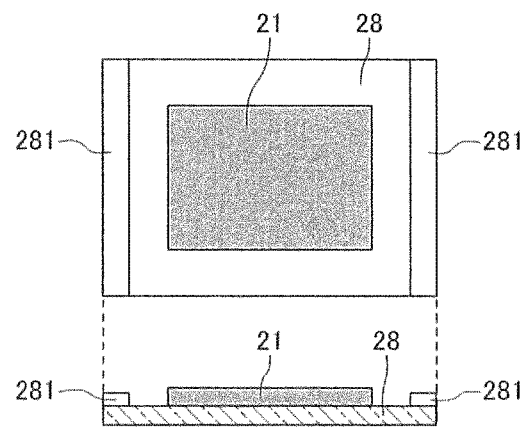
FIG. 6 shows another example concerning a method of adhering an adhesive sheet according to Embodiment 1.
Figure 7:
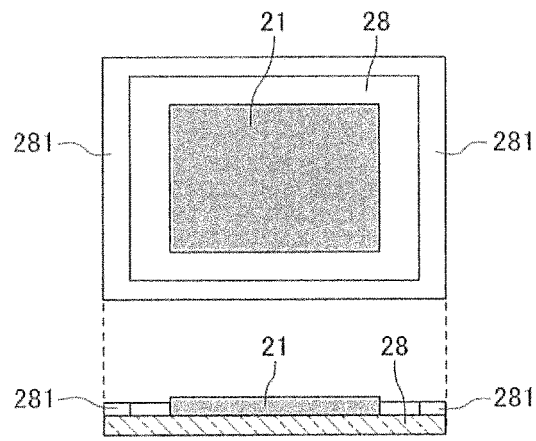
FIG. 7 shows another example of a method of adhering the adhesive sheet according to Embodiment 1.
Figure 8:
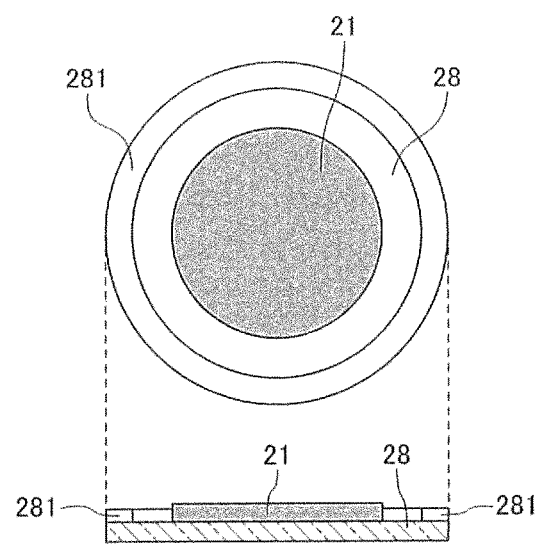
FIG. 8 shows another example of a method of adhering the adhesive sheet according to Embodiment 1.

Various shapes can be adopted as the shape of the adhesive sheet regulation jigs 281 for fixing the adhesive sheet 28 according to the shape of the substrate 21 to be used. FIG. 6 to FIG. 8 show examples of forming various shapes of the adhesive sheet 28 and the adhesive sheet regulation jigs 281 according to the embodiment. When the substrate 21 has a rectangular shape, for example, the adhesive sheet regulation jigs 281 are arranged in right and left both sides of the substrate 21 as shown in FIG. 6 or are arranged so as to surround the substrate 21 as shown in FIG. 7. Accordingly, the tension of the adhesive sheet 28 can be stabilized. When the substrate 21 has a circular shape, the adhesive sheet regulation jig 281 is formed to have a circular ring shape as shown in FIG. 8. Accordingly, the tension of the adhesive sheet 28 can be formed to be isotropic.

Embodiment 2

Next, an imprinting method according to Embodiment 2 will be explained with reference to the drawings. The method of curing the UV curing resin 22 protruding from the outer periphery of the substrate 21 in the advance curing process shown in FIG. 1B has been described in Embodiment 1. On the other hand, Embodiment 2 differs from Embodiment 1 in a point that part of the UV curing resin 22 protruding from the outer periphery of the substrate 21 is not cured.

Figure 9A:
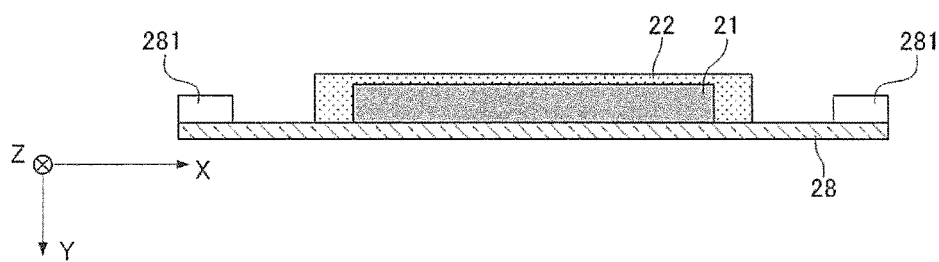
FIG. 9A shows a resin application process in an imprinting method according to Embodiment 2.

FIGS. 9A to 9D show schematic views showing a process flow of an imprinting method according to Embodiment 2. The same symbols are given to portions which are the same as or correspond to those of FIGS. 1A to 1E for simplifying the explanation. As the resin application process shown in FIG. 9A is the same as explained in FIG. 1A of Embodiment 1, the explanation is omitted.

Figure 9B:
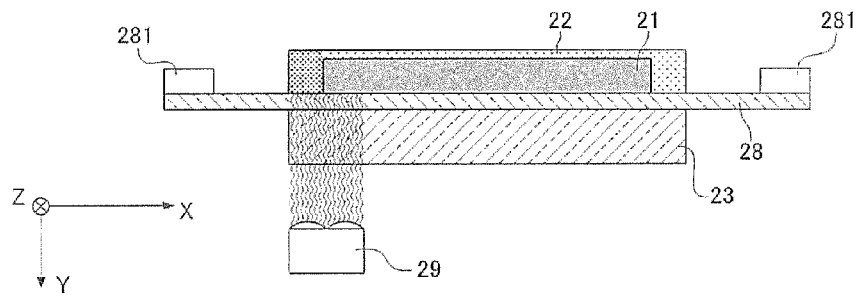
FIG. 9B shows an advance curing process in the imprinting method.

In the advance curing process shown in FIG. 9B, the UV curing resin 22 in the left side of the substrate 21 in the drawing is cured but the UV curing resin 22 in the right side of the substrate 21 is not cured in the UV curing resin 22 protruding from the outer periphery of the substrate 21 and contacting the adhesive sheet 28. The details will be described later.

Figure 9C:
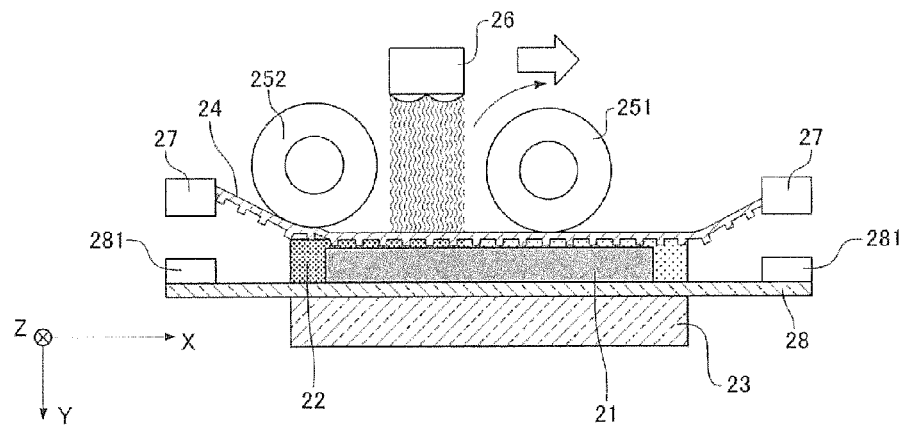
FIG. 9C shows a pressurizing/curing process in the imprinting method.

In the pressurizing/curing process shown in FIG. 9C, a pressurizing roll 251 is used as a pressurizing method, which is fed in a feeding direct ion X (from left to right in the drawing) perpendicular to an axial direction z and a pressurizing direction Y of the pressurizing roll 251 while pressurizing the film-shaped mold 24 so as to be pressed onto the UV curing resin 22, thereby sequentially pressurizing the mold 24. The UV irradiator 26 is also moved in synchronization with movement of the pressurizing roll 251 at the same time, thereby sequentially curing the UV curing resin from above. Moreover, a holding roll 252 is provided for preventing the separation of a portion of the mold 24 on which the pressurizing roll 251 has passed before curing the UV curing resin 22. The holding roll 252 is provided in an upstream side of the UV irradiator 26 in the feeding direction X.

Figure 9D:
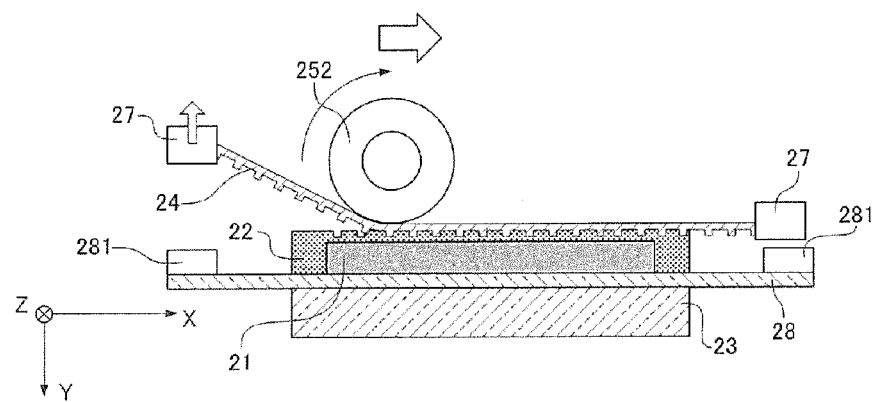
FIG. 9D shows a mold releasing process in the imprinting method.

In the mold releasing process shown in FIG. 9D, peeling is performed only from the upper stream side in the feeding direction X by lifting the mold holding tool 27 in the upper stream side while feeding the holding roll 252 in the feeding direction X. Here, as the UV curing resin 22 in the upper stream side of the substrate 21 in the feeding direction X has been cured in advance in the process shown in FIG. 9B, the adhesive force with respect to the mold 24 is small, and the adhesive force with respect to the adhesive sheet 28 is large. Accordingly, the occurrence of the film peeling between the substrate 21 and the UV curing resin 22 can be prevented, which can improve the mold, releasing property of imprinting and can stabilize the transfer quality of the fine pattern.

As the UV curing resin 22 in the downstream side of the substrate 21 in the feeding direction X is not previously cured, it is possible to promote the outflow of the UV curing resin 22 and to stabilize the transfer quality of the fine pattern. The details will be explained below.

As the pressurizing roll 251 is fed in the feeding direction X while pressurizing the UV curing resin 22 in Embodiment 2, the UV curing resin 22 on the substrate 21 is pushed out in the feeding direction X. Suppose that the entire range of the UV curing resin 22 protruding from the outer periphery of the substrate 21 is cured in FIG. 9B, the UV curing resin 22 pushed out in the feeding direction X is blocked by the UV curing resin 22 cured in the downstream side of the substrate 21. Accordingly, the UV curing resin 22 does not easily flow to the downstream side and the film thickness of the UV curing resin 22 becomes thicker in the downstream side than in the upstream side, which may reduce the transfer quality of the fine pattern.

On the other hand, the UV curing resin 22 in the downstream side of the substrate 21 is not previously cured in the embodiment, the UV curing resin 22 pushed out in the feeding direction X flows out onto the adhesive sheet 28 in the downstream side of the substrate 21. Accordingly, the film thickness of the UV curing resin 22 can be uniformed and the transfer quality of the fine pattern can be improved.

Figure 10:
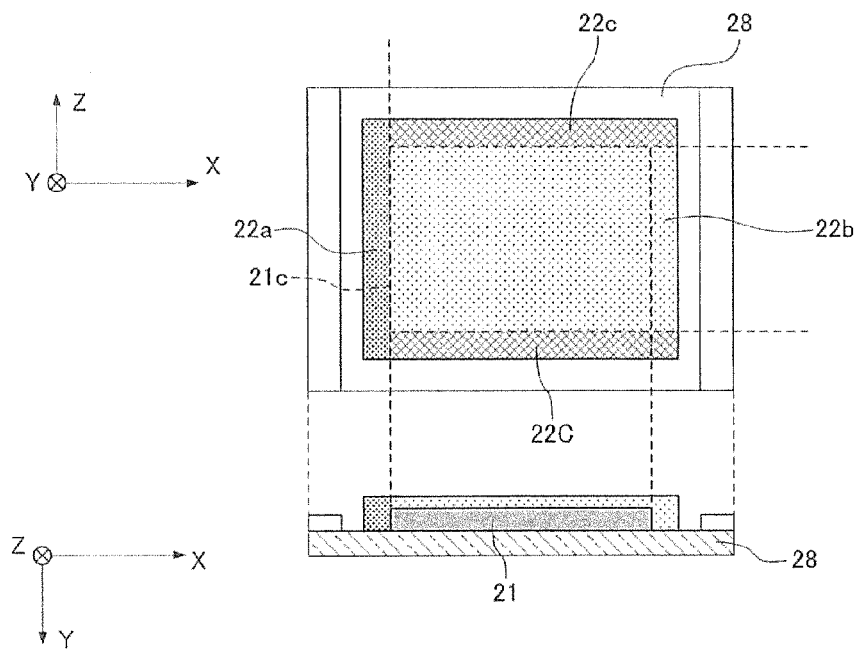
FIG. 10 is a view for explaining a portion to be cured in the advance curing process in the imprinting method.
Figure 11:
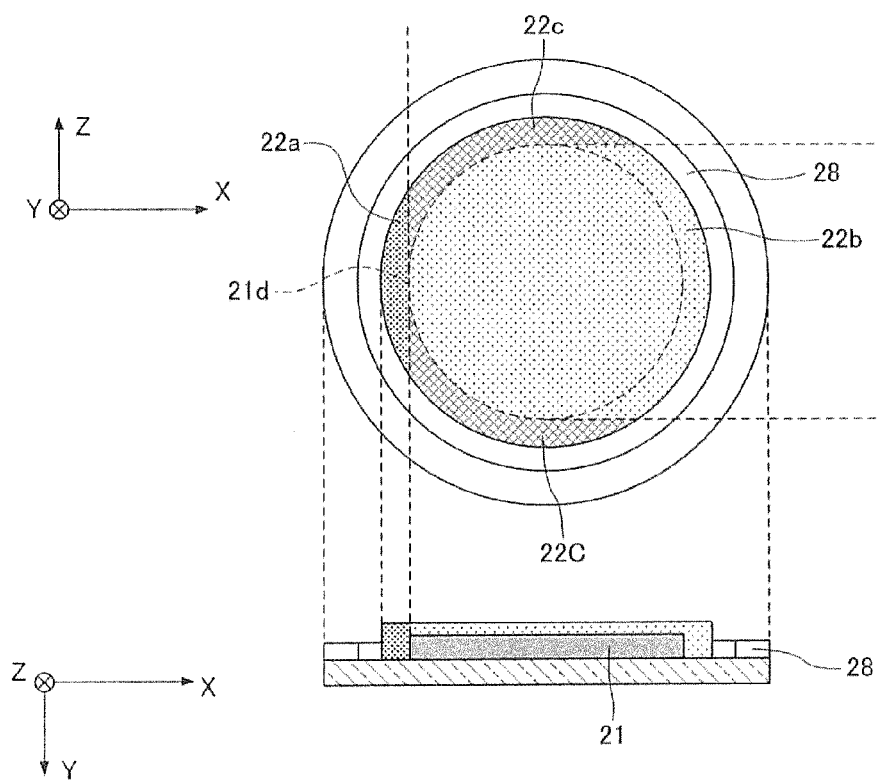
FIG. 11 is a view for explaining a portion to be cured in the advance curing process in the imprinting method.

FIG. 10 and FIG. 11 are plan views for giving an explanation about portions to be cured in the advance curing process in cases where the substrate has a rectangular shape or has a circular shape. In the drawings, symbols "22a" denote portions to be cured in the advance curing process, indicating portions of the UV curing resin in the upstream side of the substrate 21 in the feeding direction X. Symbols "22b" denote portions not to be cured in the advance curing process, indicating portions of the UV curing resin in the downstream side of the substrate 21 in the feeding direction X. Symbols "22c" denotes portions of the UV curing resin other than the above, indicating portions which may or may not be cured in the advance curing process.

In the case where the substrate 21 has the rectangular shape, the portion 22a of the UV curing resin 22 positioned in a further upstream side of one edge 21c which is the most upstream side of the substrate 21 in the feeding direction X is cured as shown in FIG. 10. The portion 22b of the UV curing resin in the downstream side of the substrate 21 in the feeding direction X is not cured for promoting the outflow of the UV curing resin 22. In the case where the substrate 21 has the circular shape, it is necessary to cure the portion 22a of the UV curing resin in a further upstream side of one edge 21d which is the most upstream, side of the substrate 21 in the feeding direction. X as shown in FIG. 11. The area will be a shape formed by an arc and a chord. The portion 22b of the UV curing resin in the downstream side of the substrate 21 in the feeding direction X is not cured for promoting the outflow of the UV curing resin 22.

In Embodiment 2, the UV curing resin 22 in the upstream side of the substrate 21 in the feeding direction X is cured and the UV curing resin 22 in the downstream side of the substrate 21 is not cured in the advance curing process shown in FIG. 9B. Instead of that, it is also possible that the UV curing resin 22 is applied to the adhesive sheet 26 in the upstream side of the substrate 21 in the feeding direction X and that the UV curing resin 22 is not applied to the adhesive sheet 28 in the downstream side of the substrate 21 in the resin application process. Accordingly, the same effects as the above can be obtained.

That is, when the UV curing resin 22 in the upstream side of the substrate 21 is cured by being irradiated with the UV light, the adhesive force between the UV curing resin 22 and the mold 24 is reduced and the adhesive force between the UV curing resin 22 and the adhesive sheet 23 is increased. It is thus possible to prevent the occurrence of film peeling between the substrate 21 and the UV curing resin 22, therefore, the mold releasing property of imprinting can be improved and the transfer quality of the fine pattern can be stabilized. As the UV curing resin 22 is not applied to the downstream side of the substrate 21 in the feeding direction X, it is possible to promote the outflow of the UV curing resin 22 and to stabilize the transfer quality of the fine pattern.

Figure 12:
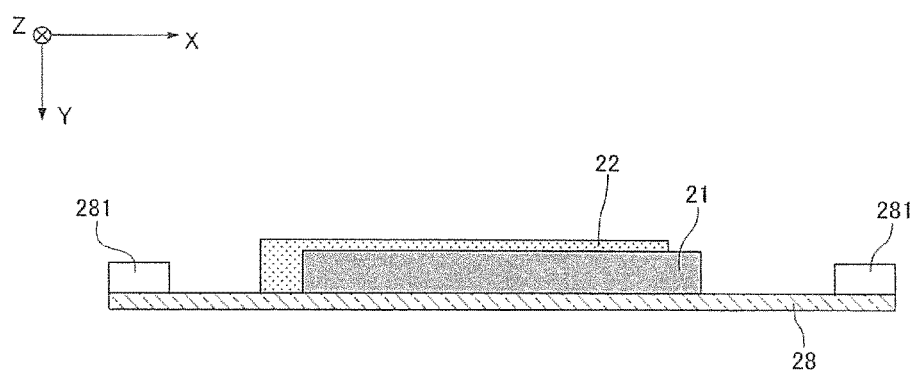
FIG. 12 shows another example concerning the resin application process according to Embodiment 2.
Figure 13:
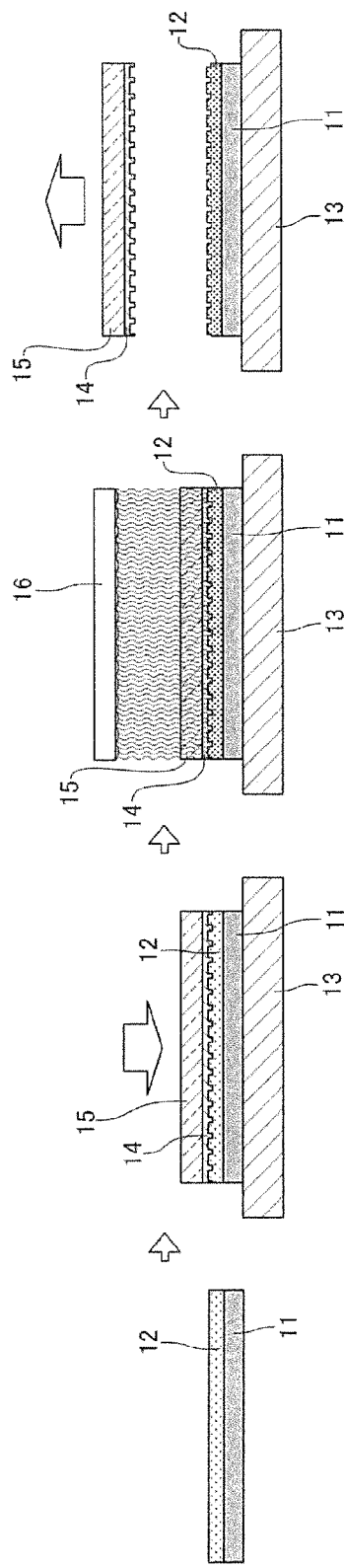
FIG. 13 shows the outline of a common UV imprinting method.
Figure 14:
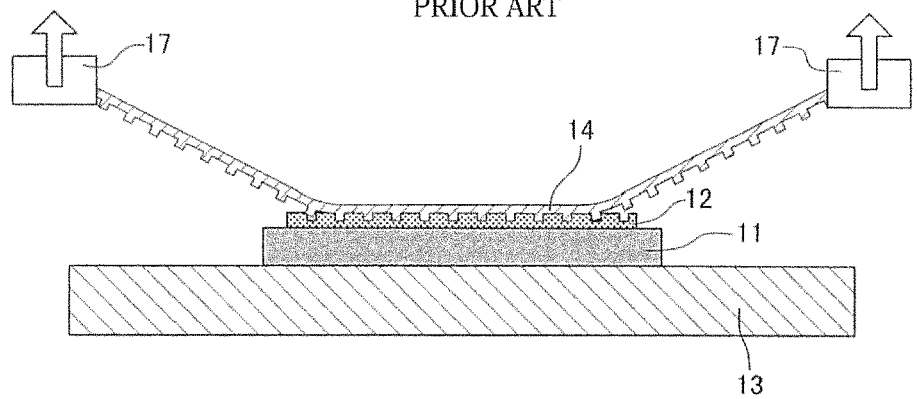
FIG. 14 is a schematic view of a roll imprinting method described in Patent Document 1.
Figure 15:
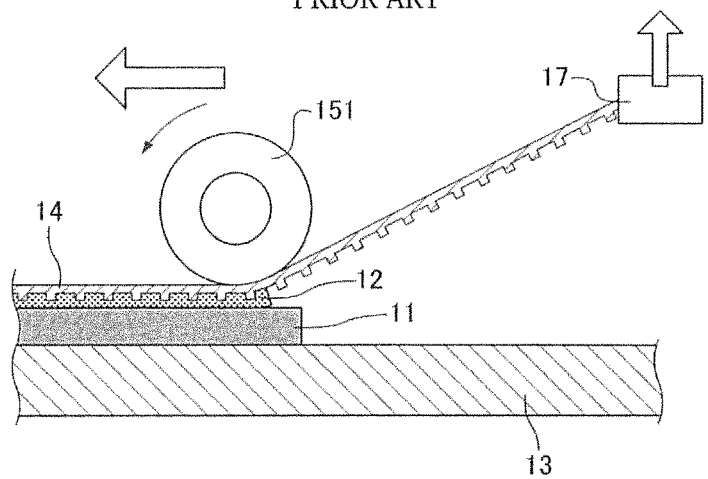
FIG. 15 is a schematic view of a roll imprinting method described in Patent Document 2.
Figure 16:
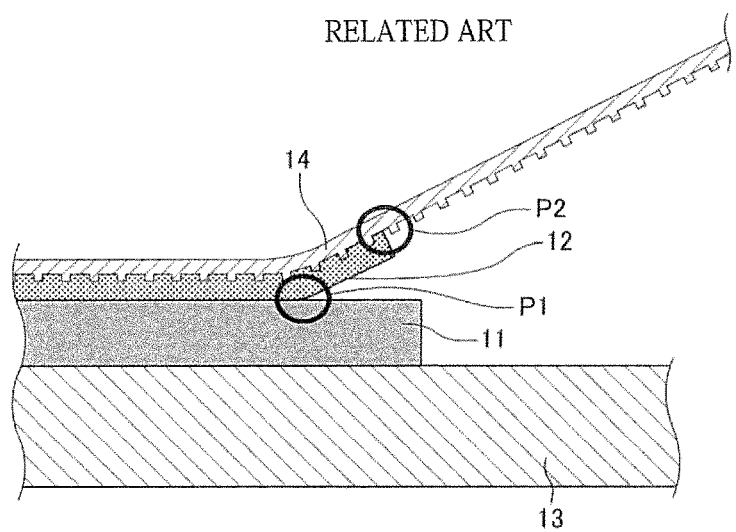
FIG. 16 is a schematic view for explaining a problem of a related-art imprinting method.

Here, the portions to which the UV curing resin is applied in the resin application process will be explained with reference to FIG. 10 and FIG. 11. In the drawings, the symbols 22a denote portions to which the UV curing resin 22 is applied in the resin application process. The symbols 22b denote portions to which the UV curing resin 22 is not applied in the resin application process. The symbols 22c denote portions to which the UV curing resin 22 may or may not be cured in the resin application process. It is also possible that part of the surface of the substrate 21 in the downstream side in the feeding direction X is exposed without covering the entire surface as shown in FIG. 12 on the assumption that the UV curing resin 22 on the substrate 21 is pushed out to some degree in the feeding direction X.

In Embodiment 2, the state where the UV curing resin 22 in the side where the peeling is performed is cured without curing the entire surface of the UV curing resin 22 protruding from the outer periphery of the substrate 21 by using the pressurizing roll 251 as a pressurizing member has been described. Instead of that, when the state where the UV curing resin 22 in the side where the peeling is performed is cured without curing the entire surface of the UV curing resin 22 protruding from the outer periphery of the substrate 21 by using the flat tool or the fluid pressure explained in Embodiment 1 as the pressurizing member is adopted, the same effects can be obtained.

In Embodiments 1 and 2, the UV irradiator applies the UV light to the UV curing resin 22 through the mold 24 having the UV transmittance to cure the UV curing resin 22, however, it is not limited to this. It is also possible to adopt a structure in which the mold 24 has a transmittance with respect to light other than UV, a resin to be cured by light other than UV is used, and the light irradiator applying light other than UV is used.

The imprinting method and the imprinting device according to the above embodiments is capable of improving the transfer quality of the fine pattern by improving the mold release property.

What is claimed is:

1. An imprinting device comprising:
an adhesive sheet to which a reverse surface of a substrate is adhered to thereby hold the substrate, having a light transmittance and flexibility;
a resin application device configured to apply a light curing resin so that the resin covers a surface of the substrate and protrudes from an outer periphery of the substrate to contact the adhesive sheet;
a stage on which the substrate is placed through the adhesive sheet, having a light transmittance;
a first light irradiator configured to irradiate at least part of the outer periphery of the substrate with light through the stage and the adhesive sheet and harden the light curing resin protruding from the outer periphery of the substrate with the light transmittance;
a mold on which a fine pattern is formed on a first surface facing the surface of the substrate, having a light transmittance and flexibility;
a pressurizing member configured to pressurize a second surface opposite to the first surface of the mold and the hardened light curing resin protruding from the outer periphery of the substrate; and
a second light irradiator which can irradiate the surface of the substrate with light through the mold,
wherein the pressurizing member has a roll shape having a central axis and sequentially pressurizes the mold with respect to the light curing resin by being fed in a feeding direction perpendicular to a central-axis direction and a pressurizing direction while pressurizing the second surface of the mold,
wherein the mold has a film shape and is attached to a mold holding tool,
wherein a holding roll is provided for preventing separation of a portion of the mold,
wherein the mold holding tool is configured to lift the mold to an upper stream side to peel the mold from the hardened light curing resin while feeding the mold to the holding roll in the feeding direction,
the first irradiator moves in synchronization with movement of the pressurizing member and sequentially cures the light curing resin on the surface of the substrate.

* * * * *